United States Patent [19]

Zangara

[11] Patent Number: 4,703,200
[45] Date of Patent: Oct. 27, 1987

[54] STATIC BISTABLE FLIP-FLOP CIRCUIT OBTAINED BY UTILIZING CMOS TECHNOLOGY

[75] Inventor: Louis Zangara, Seyssins, France

[73] Assignee: Societe pour l'Etude de la Fabrication des Circuits Integres Speciaux - E.F.C.I.S., Grenoble, France

[21] Appl. No.: 832,662

[22] Filed: Feb. 25, 1986

[30] Foreign Application Priority Data

Feb. 28, 1985 [FR] France ............................ 85 02972

[51] Int. Cl.⁴ .................. H03K 3/037; H03K 3/356; H03K 17/04; H03K 19/017
[52] U.S. Cl. ............................ 307/279; 307/451; 307/481; 307/576; 377/117; 377/79
[58] Field of Search ............... 307/272 A, 279, 443, 307/451, 452, 481, 575, 576, 579, 583, 585; 377/79, 105, 117, 121

[56] References Cited

U.S. PATENT DOCUMENTS

| | | | |
|---|---|---|---|
| 4,250,406 | 2/1981 | Alaspa | 307/452 |
| 4,253,162 | 2/1981 | Hollingsworth | 365/175 |
| 4,390,987 | 6/1983 | Best | 307/243 |
| 4,495,628 | 1/1985 | Zasio | 377/79 X |

FOREIGN PATENT DOCUMENTS

| | | | |
|---|---|---|---|
| 3428393 | 2/1986 | Fed. Rep. of Germany | 377/79 |
| 79328 | 5/1983 | Japan | 307/272 A |
| 92136 | 6/1983 | Japan | 307/585 |
| 79599 | 5/1985 | Japan | 377/79 |
| WO84/03806 | 9/1984 | PCT Int'l Appl. | |
| 1113111 | 5/1968 | United Kingdom | |
| 2131993 | 6/1984 | United Kingdom | |

OTHER PUBLICATIONS

Patents Abstracts of Japan, vol. 4, No. 28 (E-1) [510], 8 mars 1980; & JP-A-55 3234 (Tokyo Shibaura Denki K.K.) 11.01.1980.

Siemens Forschungs-und Entwicklungsberichte, vol. 5, No. 6, 1976, pp. 344-349, Springer-Verlag, Berlin, DE; E. Gonauser et al.: "A Master Slice Design Concept Based on Master Cells in ESFI-SOS-CMOS Technology", p. 345, colonne de droite, lignes 2-6; p. 347, FIG. 7.

Primary Examiner—Stanley D. Miller
Assistant Examiner—David R. Bertelson
Attorney, Agent, or Firm—Oblon, Fisher, Spivak, McClelland, & Maier

[57] ABSTRACT

A static bistable flip-flop circuit using CMOS technology. The flip-flop reduces the number of CMOS transistors by not using two complimentary transistors in parallel for certain switches. This reduces the risk of transparency which is inherent with conventional CMOS complimentary transistors. Between the input and output of the circuit there is only a first N channel transistor, a first inverter, a second N channel transistor and a second inverter connected in series.

5 Claims, 3 Drawing Figures

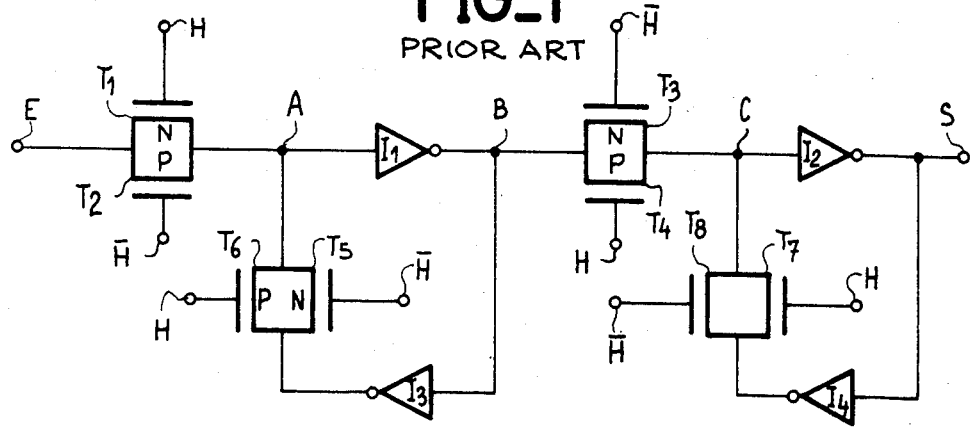
FIG_1
PRIOR ART
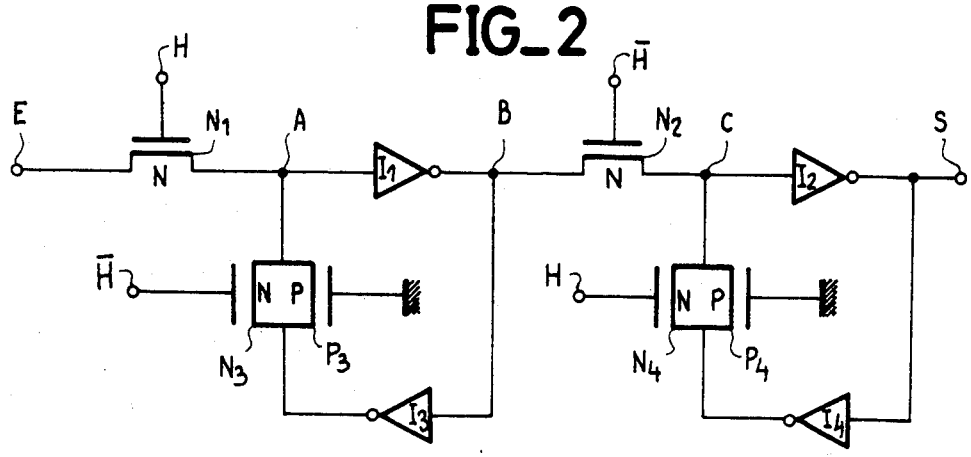
FIG_2
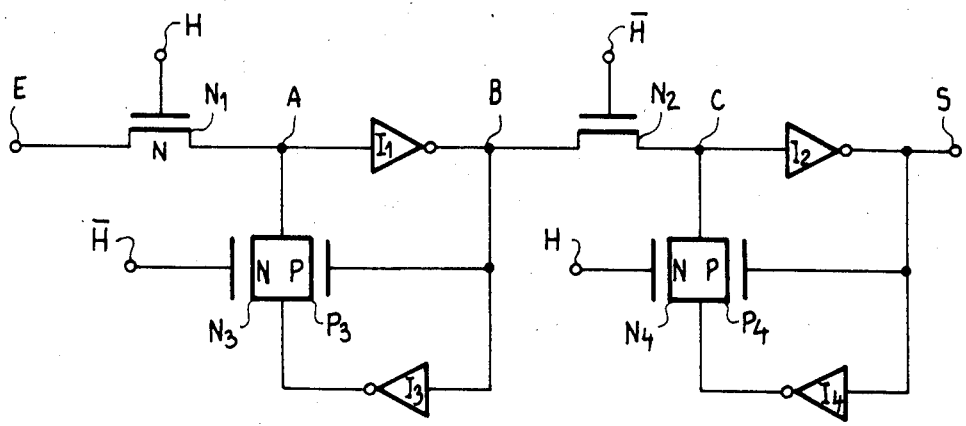
FIG_3

STATIC BISTABLE FLIP-FLOP CIRCUIT OBTAINED BY UTILIZING CMOS TECHNOLOGY

BACKGROUND OF THE INVENTION

1. Field of the Invention

The present invention relates to integrated circuits obtained through utilizing CMOS technologies, i.e. utilizing simultaneously upon a single semiconductive substrate N channel field effect transistors and P channel field effect transistors.

Numerous logic circuits known according to the prior art require the use of static bistable flip-flop circuits (latched D flip-flops).

FIG. 1 represents a conventional static bistable flip-flop circuit, obtained by utilizing CMOS technology.

This flip-flop circuit comprises an input E, an output S, and between the two, an assembly in series comprising a first switch, a first inverter stage, a second switch and a second inverter stage. The flip-flop circuit is controlled by two complementary periodic clock signals H and $\bar{H}$.

The first switch comprises a MOS N channel transistor T1 parallel with a MOS P channel transistor T2, both these transistors being positioned between the input terminal E and the input A of an inverter I1 of the first inverter stage. The gate of the N channel transistor T1 is controlled by the clock signal H and the gate of the P channel transistor T2 is controlled by the complementary clock signal $\bar{H}$.

The second switch comprises a MOS N channel transistor T3 parallel with a MOS P channel transistor T4; both these transistors are positioned between the output B of the inverter I1 and the input C of an inverter I2 of the second inverter stage. The gate of the N channel transistor T3 is controlled by the complementary clock signal $\bar{H}$; the gate of the P channel transistor T4 is controlled by the clock signal H.

The first inverter stage comprises, between the circuit connecting points A and B, in addition to the inverter I1 which has its input connected to the point A and its output to the point B, a holding loop comprising a third inverter I3 and a third switch. The third inverter has its input connected to the point B and its output connected to the point A through the third switch. The third switch comprises a MOS N channel transistor T5 parallel to a MOS P channel transistor T6. The gate of the N channel transistor T4 is controlled by the complementary clock signal H; the gate of the P channel transistor T6 is controlled by the clock signal H.

In the same way, the second inverter stage comprises, between the connecting point C and the output S of the flip-flop, on the one hand the inverter I2 which has its input connected to the point C and its output connected to the output S, and on the other hand, a holding loop comprising a fourth inverter I4 and a fourth switch. The fourth inverter has its input connected to the terminal S and its output connected to the fourth switch; the fourth switch is furthermore connected to the point C and it comprises in parallel a N channel transistor T7 and a P channel transistor T8; the gate of the N channel transistor T7 is controlled by the clock signal H. The gate of the P channel transistor T8 is controlled by the complementary clock signal $\bar{H}$.

The inverters are each generally constituted by two complementary transistors in series between two power supply terminals (not represented) supplying a voltage VCC. The input of the inverter is taken upon the connected gates of the two transistors, the output upon their drains.

The operating mode of the flip-flop is the following:

(a) first half-period: H at the logic level 1

T1 and T2 are conductive, T3 and T4 blocked, T5 and T6 blocked. The logic level of the input E is inverted at the output B of the inverter I1. The operation of the second inverter stage is in no way influenced by the input E since the transistors T3 and T4 are blocked.

(b) second half-period; $\bar{H}$ at the logic level 1;

T1 and T2 are blocked; the input E in no way impairs the state of the flip-flop; T5 and T6 are rendered conductive and the preceding state of the connecting point B is confirmed by the application of the complement of this state upon the connecting point A through the inverter I3 and the transistors T5, T6. This state of the connecting point B, confirmed by this locking loop, is furthermore transmitted to the input C of the second inverter I2 and the output S thus assumes the complementary state of that of the connecting point B.

(c) first half-period of the following period;

H is the logic level 1. The state of the output S is confirmed by the locking loop of the second stage since T7 and T8 become conductive at the same time as T3 and T4 are blocked.

This conventional flip-flop assembly presents a certain number of drawbacks that the present invention to a large extent eliminates.

(1) The mode of operating described herein-above is only effective if the signals H and $\bar{H}$ are strictly complementary, since, if there is partial overlapping of the signals H and $\bar{H}$, there is a risk of direct transmission of the input signals occurring towards the output without locking by one of the groups of transistors T1, T2 or T3, T4: for example if H and $\bar{H}$ present an overlapping lapse of time during which H and $\bar{H}$ are practically both at the level 1, T1 and T3 are simultaneously conductive, which is not admissible; this also happens if the signals H and $\bar{H}$ have insufficiently steep rising fronts.

When the operating frequency increases, it becomes extremely difficult to form complementary signals H and $\bar{H}$ without overlapping (i.e. perfectly complementary signals presenting very steep rising and falling fronts).

(2) In any case, it is very difficult to obtain signals having very steep rising fronts when these signals are applied to a capacitive load; the gates of the various transistors controlled by the clocks H and $\bar{H}$ are effectively capacitive loads; the greater the number of transistors, the more difficult it becomes to preserve the steep fronts for the clock signals. It should not be overlooked that in practice an integrated circuit could comprise numerous flip-flops controlled by the same clock signals. It is therefore worth-while to reduce the number of transistors utilized.

(3) One problem which must be taken into account in designing a flip-flop, or more generally in designing an inverter (and the flip-flop represented in FIG. 1 comprises four inverters), is the input voltage level from which the inverter flips (in one direction or the other): it is necessary that the inverter flips completely for an intermediary input voltage value between the voltage that defines the low logic level and that which defines the high logic level.

For example, for a logic circuit theoretically operating between 0 and 5 volts, it is possible to have an arrangement whereby the flipping over occurs at 2.5 volts. Since the mobility of the electrical charges in the P channel transistors is lower than the in the N channel transistors, this problem is generally overcome by providing P channel transistors twice as great as the N channel transistors in the inverters. But this arrangement increases the overall bulk of the flip-flop circuit and constitutes a major drawback.

In order to overcome these drawbacks, the present invention proposes to dispense with utilizing for certain switches two complementary transistors in parallel. In order to fully understand the unexpecfed aspect of this proposition, it should be recalled that in CMOS technology, efforts are made wherever possible to utilize as switch an assembly of two complementary MOS transistors actuated by two complementary clock signals; this is true, in particular, each time that a switch has to be placed upstream of an inverter.

The reason for this quasi-universal arrangement is the following: if the switch had only been constituted by a single N channel transistor there would be no problem in transmitting a logic level (0 volt) through the switch towards the input of the inverter; if there is 0 volt at the input of the N channel transistor while this transistor is rendered conductive, there is also 0 volt upon its output. But, in order to transmit a high level (5 volts) this is no longer the case; in fact, if there is a value of 5 volts at the input of the N channel transistor while it is rendered conductive, there will only be 5 volts-Vt at its output, Vt being the threshold voltage of the transistor. The inverter, according to CMOS technology, is constituted by a P channel transistor in series with a N channel transistor, the gates of the two transistors being connected together in order to constitute the input of the inverter; applying 5 volts-Vt at the input of the inverter is therefore certainly sufficient to render the N channel transistor conductive, but it is insufficient to suitably block the P channel transistor. The inverter does not operate correctly; it consumes power. This is the reason why provision is always made upstream from a CMOS inverter, since it has been established that this problem exists, for switches provided with two complementary transistors in parallel, the two transistors being actuated by complementary clock signals. When the second transistor of the switch must transmit a high level (5 volts) it transmits correctly this high level without causing it to drop by a threshold voltage.

According to the invention, a static bistable flip-flop circuit, produced by CMOS technology, is foreseen, comprising an input, an output, a first inverter, a first switch connecting the input of the flip-flop to the input of the first inverter, a second inverter, a second switch connecting the output of the first inverter to the input of the second inverter, a third inverter, a third switch connecting the output of the third inverter to the input of the first inverter, a fourth inverter, a fourth switch connecting the output of the fourth inverter to the input of the second inverter, the first switch and the fourth switch being simultaneously controlled by a first clock signal and the second and the third switches being simultaneously controlled by a second clock signal in phase opposition with the first, characterized in that:

each switch is constituted by a single field effect N channel transistor, the gate of which is controlled by the first clock signal (first and fourth switches) and by the second clock signal (second and third switches);

two MOS P channel transistors are foreseen, the first P channel transistor being placed in parallel on the third switch and having its gate connected to a first circuit connecting point so that it is conductive at least when the output of the first inverter is at a low logic level, and the second P channel transistor being placed in parallel on the fourth switch and having its gate connected to a second circuit connecting point so that it is conductive at least when the output of the second inverter is at a low logic level.

The first circuit connecting point can be the output of the first inverter or a point having a reference voltage constituting a low logic level, for example earth ground.

The second circuit connecting point can be the output of the second inverter or a point having a reference voltage constituting a low logic level, for example earth ground.

BRIEF DESCRIPTION OF THE DRAWINGS

Other objects, features and advantages of the present invention will become apparent from reading the following description, given with reference to the appended drawings in which:

FIG. 1 already described herein-above represents a conventional flip-flop according to the prior art;

FIG. 2 represents a first embodiment of the flip-flop circuit according to the invention;

FIG. 3 represents a second embodiment of the flip-flop according to the invention.

DETAILED DESCRIPTION OF THE DRAWINGS

The diagram of the locking flip-flop circuit such as represented in FIG. 2 is analog in its structure to that shown in FIG. 1, with the exception that it now shows clearly that:

the switches are each constituted by a single N channel transistor controlled either by the clock signal H or by the complementary clock signal $\overline{H}$: the transistor N1 (first switch placed between the input E of the flip-flop circuit and the input A of the first inverter T1) is controlled by the signal H; the transistor N2 isolating the first inverter T1 from the second inverter T2 is controlled by the signal $\overline{H}$; the transistor N3 connecting the output of the third inverter I3 to the input of the first inverter I1 is controlled by the signal $\overline{H}$; similarly, the transistor N4, connecting the output of the fourth inverter I4 to the second inverter I2 is controlled by the signal H.

furthermore, two P channel transistors P3 and P4 are provided whose dimensions are not critical to their operation (for example, of the same channel width as the transistors N3 and N4), one of which is placed in parallel on the transistor N3 and the other of which is placed in parallel on the transistor N4; the gates of these transistors being connected to earth ground or to any voltage intended to render them effectively conductive.

The operating mode of this circuit is itself basically analog to that represented in FIG. 1; but with one fundamental difference that shows the unexpected character of the circuit diagram according to the invention; whereas in the flip-flop represented in FIG. 1 nothing prevents the state change of the first inverter during the clock H phase, nor the state change of the second inverter during the clock $\overline{H}$ phase, there now exists a conflict between the direct signal imposed by the input and the signal imposed by the locking loops.

For example, if the state locked by the inverter I3 is a high logic level on the connecting point A, and if it is desired to force a low state through the input E during the H phase, there is a temporary conflict through the transistors P3 and N1 that are conductive and have a tendency to impose contradictory states upon the connecting point A.

Under these conditions, the connecting point A assumes initially a voltage that depends upon the relations between the conductances of the transistors located on either side of the connecting point. Dispositions have been taken so that the conductances are such that the connecting point A assumes a voltage high enough to change the state of inverter I1. Immediately, the conflict or conflict is interrupted since the inverter I3 also flips over and now applies the same logic level as the input E. Only a short transitory phase is thus critical but it can be overcome by conferring appropriate dimensions upon the transistors. In practice, it is possible to produce the transistors, for example, having the following dimensions, expressed by the ratio W/L between the width of the gate W and the length of channel L of the transistors:

transistors of the inverters, including those which would be upstream from the input E of the flip-flop: W/L=3/2, transistor N1, N2: W/L=5/2 (wide transistor),
transistors P3, P4: W/L=3/5 (long transistors).

Examination will now be made of what occurs when the locked state on the connecting point A is a high state and it is desired to force a low state through the input E. First of all, it is checked that the situation is identical: a transitory conflict exists and disappears very rapidly if the dimensions of the transistors are correctly chosen. In fact, it is possible to check that this conflict is much less critical than the previous one (in the case where the inverters comprise transistors N and P having the same dimension), this being due to the normally weaker conductivity of the P channel transistors. The dimensions selected for the transistors herein-above by way of example in order to allow the state change in the low towards the high state direction (connecting point A) are more favorable to the state change in the counter direction.

The situation thus described herein-above with respect to connecting point A is exactly the same as that applicable to the connecting point C.

FIG. 3 represents another embodiment of the invention. The gate of the transistor P3 is no longer to earth ground but connected to the output of the inverter I1. Furthermore, the gate of the transistor P4 is connected to the output of the inverter I2.

When the high logic state is locked on the connecting point A, the situation is exactly the same as that prevailing in the case represented in FIG. 2; the P3 transistor is conductive. There is a temporary conflict if it is desired to force the connecting point A to a low state through the input E during the clock H signal. This conflict is moreover the existing situation which is the easiest to overcome as described herein-above (easier than the conflict existing when forcing a high state when a low state is locked).

When a low logic state is locked on the connecting point A, there is no problem of conflict since the gate of the transistor P3 is at a low logic level that blocks it; the output of the invert I3 is thus isolated from the connecting point A by the transistors N3 and P3, both of which are blocked.

The configuration of FIG. 3 thus considerably reduces this problem of state change conflicts, but it imposes a supplementary capacitive load for the inverters I1 and I2 which have now to control by the transistors P3 and P4.

In the case of FIG. 3, it is possible to choose the same W/L ratios as those indicated in FIG. 2. However, the transistors P3 and P4 can be shorter, for example, identical to the transistors of inverters (W/L=3/2) since the conflict problem to be overcome only exists for the conflict direction that is the easiest to overcome.

It is well understood that it is possible to envisage FIGS. 2 and 3 be mixed, i.e. that a stage be realized with the P channel transistor controlled by earth ground and the other stage with the P channel transistor controlled by the output of the inverter I1 or I2.

From these circuit diagrams according to the invention, the following advantages are obtained:

(1) the number of transistors of the circuit, apart from the transistors constituting the inverters, is only six (instead of eight), thereby reducing the bulk of the flip-flop circuit;

(2) the number of transistors controlled by the clock signals is only four (instead of eight), thereby reducing the capacitive load of the lines conveying the clock signals;

(3) there is no longer any need to foresee clock signals that are as perfectly complementary and have extremely steep fronts such as was previously necessary. It is in fact sufficient that the high level of $\overline{H}$ be completely separate from the high level of H (no overlapping of the high levels). But the low levels can be slightly overlapping without causing any problem since there is no longer a P channel transistor in the direct chain between the input E and the output S. The operating rapidity can thus be increased;

(4) the transistors constituting the inverters can be of the same width (instead of a double width which is most frequently foreseen for the P channel transistors), thereby further reducing the space required for the flip-flop circuit;

(5) when a high logic level is applied to the input E, the connecting point A passes to the high level, possibly after temporary conflict; the transistor P3 is thus conductive or becomes conductive (FIG. 3) and the voltage brought on the connecting point A through a conductive P channel transistor is a true high logic level and not a high level reduced by a transistor threshold voltage.

I claim:

1. A static bistable flip-flop circuit, produced by CMOS technology, comprising an input, an output, a first inverter, a first switch connecting the input of the flip-flop to the input of the first inverter, a second inverter, a second switch connecting the output of the first inverter to the input of the second inverter, a third inverter, a third switch connecting the output of the third inverter to the input of the first inverter, a fourth inverter, a fourth switch connecting the output of the fourth inverter to the input of the second inverter; the output of the first inverter being connected to the input of the third inverter, the output of the second inverter being connected to the input of the fourth inverter; the first switch and the fourth switch being simultaneously controlled by a first clock signal and the second and the third switches being simultaneously controlled by a second clock signal in phase opposition with the first, wherein:

each switch is constituted by a single field effect N channel transistor, the gate of first and fourth switches is controlled by the first clock signal and the gate of second and third switches is controlled by the second clock signal;

and including two MOS P channel transistors, the first P channel transistor being placed in parallel with the third switch and having its gate connected to a first circuit connecting point so that it is conductive at least when the output of the first inverter is at a low logic level, and the second P channel transistor being placed in parallel with the fourth switch and having its gate connected to a second circuit connecting point so that it is conductive at least when the output of the second inverter is at a low logic level.

2. Bistable flip-flop circuit according to claim 1, wherein the first connecting point of the circuit and the second connecting point of the circuit are connected to an earth ground at a low logic level.

3. Bistable flip-flop circuit according to claim 2, wherein the P channel transistors in parallel with the third and fourth switches have a channel length greater than the other transistors of the flip-flop circuit.

4. Bistable flip-flop circuit according to claim 1, wherein the first connecting point of the circuit is the output of the first inverter and the second connecting point is the output of the second inverter.

5. Bistable flip-flop circuit produced through CMOS technology according to claim 1, in which each of the inverters comprises two complementary transistors being connected in series between the inverter power supply terminals, the gates of the transistors being connected in order to constitute the input of the inverter, wherein the width of the channel is substantially the same for the two complementary transistors of the inverter.

* * * * *